United States Patent [19]
Erdman, deceased et al.

[11] B 3,990,925
[45] Nov. 9, 1976

[54] REMOVAL OF PROJECTIONS ON EPITAXIAL LAYERS

[75] Inventors: William Charles Erdman, deceased, late of Danielsville, Pa., by Charlotte Erdman, executrix; Lewis Emanuel Katz, Allentown, Pa.

[73] Assignee: Bell Telephone Laboratories, Incorporated, Murray Hill, N.J.

[22] Filed: Mar. 31, 1975

[21] Appl. No.: 563,722

[44] Published under the second Trial Voluntary Protest Program on January 13, 1976 as document No. B 563,722.

[52] U.S. Cl. .................................. 156/3; 29/580; 29/583; 156/6; 156/17
[51] Int. Cl.² ................................ H01L 21/304
[58] Field of Search ............... 156/6, 17, 3; 29/580, 29/583; 83/24

[56] References Cited
UNITED STATES PATENTS

| | | | |
|---|---|---|---|
| 3,699,644 | 10/1972 | Cocca | 29/583 |
| 3,718,514 | 2/1973 | Erdman et al. | 156/17 |
| 3,738,881 | 6/1973 | Erdman et al. | 156/17 |
| 3,783,044 | 1/1974 | Cheskis et al. | 156/17 |
| 3,838,501 | 10/1974 | Umbaugh et al. | 29/583 |

*Primary Examiner*—William A. Powell
*Assistant Examiner*—Jerome W. Massie
*Attorney, Agent, or Firm*—H. W. Lockhart

[57] ABSTRACT

A method for removing projections from the surface of epitaxially-deposited semiconductor layers is described. These projections can adversely affect the results of photolithographic processing. The method comprises forming an oxide layer on the surface and mechanically fracturing the oxide-coated projections. In the ensuing step anisotropic semiconductor etchants are applied to the surface to remove the projections selectively.

5 Claims, 5 Drawing Figures

REMOVAL OF PROJECTIONS ON EPITAXIAL LAYERS

BACKGROUND OF THE INVENTION

The invention relates to the processing of semiconductor wafers having epitaxially-deposited layers thereon.

U.S. Pat. No. 3,718,514 to W. C. Erdman and P. Miller discloses the problems associated with the growth of projections, also referred to as spikes, on semiconductor wafers during the formation thereon of epitaxial layers. The occurrence of projections stems generally from nucleation sites such as particles and crystallographic perturbations. Their suppression during the epitaxial growth process is costly and an economical removal method is preferred. The above-noted patent also discloses a technique for the selective removal of such projections by selective etching using a photoresist masking layer over an oxide layer.

Although this earlier technique has provided a considerable advance in the fabrication art it has been found that the random occurrence of pinholes in the photoresist film results in unwanted etch pits, referred to as extraneous etch pits. Projection etch pits referred to hereinafter are etch pits present in the wafer surface, after projection removal, at the identical site of an epitaxial projection. In some instances, using the photoresist film technique has resulted in a greater density of extraneous etch pits than of projection etch pits. Moreover, the use of the photoresist film is attended by undue complication and the possibility of added organic contamination during its formation and removal.

Efforts to remove the projections solely by mechanical means have been largely unsuccessful or, where moderately successful, have been excessively costly, involving practically hand operations. Accordingly, there is a need for a sure and simple method of projection removal which can be practiced effectively without introducing additional damage to the semiconductor wafer.

SUMMARY OF THE INVENTION

In accordance with one embodiment of the invention a semiconductor wafer having an epitaxially-deposited layer and unwanted projections is coated with an inorganic dielectric film, typically an oxide, generally in accordance with prior art practice as disclosed in the above-noted patent to Erdman and Miller. The oxide coated surface then is scraped with a sharp-edged tool. As the tool is drawn across the surface, any projections present have a high likelihood of sustaining fracture. In particular, fracture even of the oxide coating on the projection is sufficient. During this mechanical fracturing step the wafer is held securely on a stable planar platform. The tool may be manipulated by hand or held in a suitable machine assembly.

After this fracturing step the wafer is placed in a bath of an anisotropic etchant, typically an hydroxide solution. A bath of potassium hydroxide at an elevated temperature for a period of about 15 minutes is satisfactory. This procedure effectively removes all damaged projection sites and as noted above, the fracturing step is effective even if only superficial fracturing occurs. As a consequence, almost complete removal of projections with no other consequent damage to the wafer is accomplished. To increase the effectiveness of the procedure it is within the contemplation of the invention to apply the fracturing tool over the surface of the wafer more than one time and particularly through more than one orientation.

DETAILED DESCRIPTION

Figure 1:
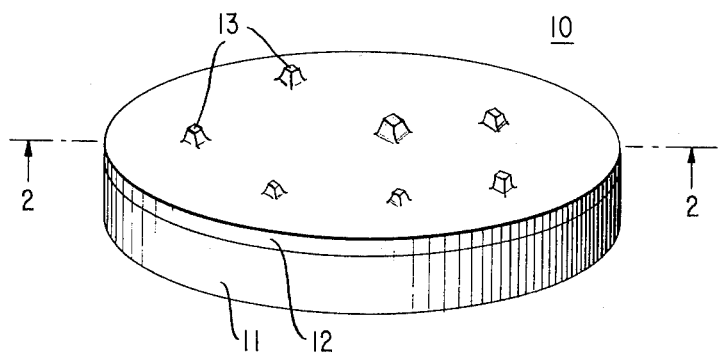
FIG. 1 is a perspective view of a semiconductor wafer including an epitaxial layer and illustrating a random distribution of projections thereon.
Figure 2:
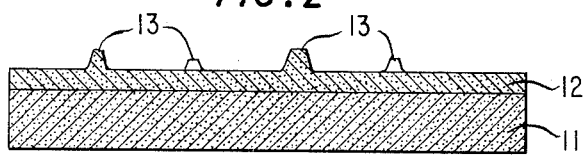
FIG. 2 through 5 schematically represent a cross section of the wafer during the steps of one embodiment in accordance with the invention.

Referring to FIGS. 1 and 2, the wafer 10 of single crystal semiconductor material comprises a substrate 11 and an epitaxial layer 12. Typically, the wafer 10 is from 2 to 4 inches in diameter and from about 10 to 30 mils thick. In particular, the epitaxially deposited layer 12 is comparatively thin and ranges, typically, from 1 to 15 micrometers thick. However, there is no particular limit on this thickness which may be of the order of 100 micrometers, if needed. The projections 13 form during the production of the epitaxial layer 12 and range, typically, from 1 to as much as 50 micrometers above the surface of the epitaxial layer 12. Generally, their height is a function of the epitaxial layer thickness.

Figure 3:
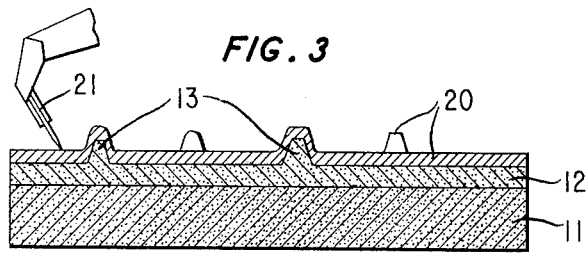

Referring to FIG. 3 the method in accordance with this embodiment includes as a first step the formation of an oxide coating 20 on the wafer surface. A variety of methods are well-known in the art for providing such coatings including plasma and thermal deposition and RF sputtering. If the semiconductor is of the type which readily forms a thick adherent oxide of its own by chemical or thermal oxidation, such technique conveniently may be used.

Moreover, in this context the term oxide is intended to encompass other suitable inorganic dielectric coatings such as silicon nitride, aluminum oxide and aluminum silicate. The criteria for this coating is that it be susceptible of convenient formation on the epitaxial layer surface and that it be adequately adherent and resistant to provide mechanical and chemical protection during the ensuing steps of the process.

In this embodiment in which the epitaxial layer 12 is of silicon, a silicon dioxide coating 20 is formed on the surface by thermal oxidation to a thickness of from about 0.3 to 0.5 micrometers. This thickness provides effective protection for the wafer surface during the ensuing processing while enabling the emergence of most of the projections from the oxide coating.

The next step of the process in accordance with this embodiment of the invention is to mechanically fracture the oxide-coated projections, thereby at least partially exposing the underlying silicon projection. For this purpose, the wafer 10 is firmly mounted and securely held and a sharp tool 21 is scraped along the surface of the wafer. This operation may be done satisfactorily by hand. It may be done also, advantageously, using a power-driven tool arranged to traverse the surface of the wafer which itself is held in a vacuum chuck during the operation. To further ensure the fracturing of the greatest number of projections the wafer may be rotated through an angle, typically ninety degrees, and the scraping operation repeated. The application of a mild detergent solution (1000 parts water-1 part Triton X-100) to the wafer surface is beneficial in removing the debris formed during the fracturing process. Triton X-100 is a proprietary product of the Rohm and Haas Company.

Figure 4:
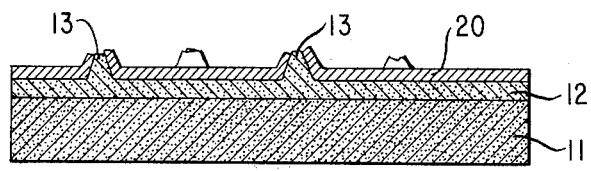

In one embodiment scraping is done using a commercial razor blade fixed and supported in a suitable holder which, in turn, is held on a machine assembly which draws the blade with a constant force, angle and speed over the wafer surface. The effect of the fracturing operation is seen in FIG. 4, in which are shown projections 13 from which the oxide coating 20 has been at least, partially removed. What is sought by this operation is at least some fracture to all projections thereby enabling exposure to a selective etchant in the succeeding step of the process. It is important to note the protective function of the oxide coating during the fracturing step. The presence of the dielectric coating prevents mechanical damage to the planar portion of semiconductor wafer surface and the thickness range set forth above is generally suitable for that purpose.

After the fracturing treatment, the wafer is placed in an etch bath of an hydroxide solution for a period of time sufficient to entirely remove the exposed projections. A suitable etch bath is a five molar aqueous solution of potassium hydroxide at 85°C. This solution has an etch rate of about 2 micrometers per minute on all silicon planes except for the (111) and is effective to remove all fractured projections within a 15 minute period. During this treatment the oxide coating continues to protect all undamaged portions of the wafer surface. The etch rate of the silicon dioxide in the potassium hydroxide etch bath is comparatively slow and is about 50 Angstroms per minute.

In the above embodiment the five molar solution is typical. However, other suitable concentrations may range from 2 to 12 molars. In addition, other suitable etching solutions are set forth in the above-noted patent to Erdman and Miller.

Figure 5:
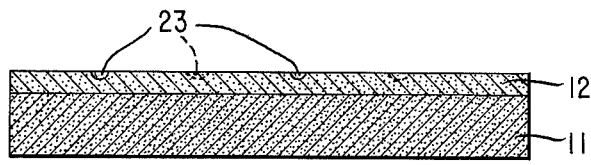

FIG. 5 illustrates the condition of the wafer following etching of the projections and removal of the oxide coating 20. In particular, the silicon dioxide can be removed by etching in suitable well-known hydroflouric acid solutions. The surface of the epitaxial layer 12 is now clear of any projections and there remain only slight etch pits 23 which mark previous locations of projections. No other incursions have been made on this surface because of the continuous protection afforded by the oxide coating.

What is claimed is:

1. The method of removing projections from the surface of a semiconductor layer epitaxially deposited onto a substrate comprising
    a. forming on said surface a coating of an inorganic dielectric material having a thickness less than the height of at least a portion of the projections,
    b. traversing tool means across said coated surface to fracture at least the coating on all the projections,
    c. treating said coated surface with an etchant which selectively attacks the semiconductor projections to thereby remove said underlying projections.

2. The method in accordance with claim 1 in which said coating material is one selected from the group consisting of silicon dioxide, silicon nitride, aluminum oxide and aluminum silicate.

3. The method in accordance with claim 1 in which said tool means comprise a sharp-edged blade.

4. The method in accordance with claim 1 in which the semiconductor is silicon, the coating is silicon dioxide and the etchant is an aqueous solution of potassium hydroxide.

5. The method in accordance with claim 4 in which said projections have a height of from about 1 to 50 micrometers, the oxide coating has a thickness of between about 0.3 and 0.5 micrometers and said etchant is an aqueous solution of potassium hydroxide in the range from 2 to 12 molar concentration.

* * * * *